(12) United States Patent
Schug (10) Patent No.: US 9,343,446 B2
(45) Date of Patent: May 17, 2016

(54) DIODE LIGHTING ARRANGEMENT

(75) Inventor: Josef Andreas Schug, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 133 days.

(21) Appl. No.: 14/119,621

(22) PCT Filed: May 30, 2012

(86) PCT No.: PCT/IB2012/052707
§ 371 (c)(1),
(2), (4) Date: Nov. 22, 2013

(87) PCT Pub. No.: WO2012/168834
PCT Pub. Date: Dec. 13, 2012

(65) Prior Publication Data
US 2014/0111894 A1    Apr. 24, 2014

(30) Foreign Application Priority Data

Jun. 8, 2011    (EP) .................................... 11169059

(51) Int. Cl.
*H01L 25/16*    (2006.01)
*H01L 27/02*    (2006.01)
(Continued)

(52) U.S. Cl.
CPC .......... *H01L 25/167* (2013.01); *H01L 27/0248* (2013.01); *H01L 27/156* (2013.01);
(Continued)

(58) Field of Classification Search
CPC combination set(s) only.
See application file for complete search history.

(56) References Cited

U.S. PATENT DOCUMENTS 6,323,598 B1 *  11/2001  Guthrie et al. ............ 315/200 A
7,564,666 B2 *  7/2009   Ball et al. .................. 361/91.5
(Continued)

FOREIGN PATENT DOCUMENTS

EP      1207563 A2      5/2002
JP      2003533013 A    11/2003
(Continued)

OTHER PUBLICATIONS

Office Action mailed Jan. 19, 2016 from Japanese Patent Application No. 2014-51418.

*Primary Examiner* — Thienvu Tran
*Assistant Examiner* — Angela Brooks (57) ABSTRACT

The invention describes a diode lighting arrangement (1A, 1B,1C) comprising a light-emitting diode arrangement (1,2) comprising at least two exposed serially connected light-emitting diodes (1) connected in parallel with an electrostatic discharge protection diode arrangement (2); and an electrostatic discharge diverting arrangement (4,50) extending in physical proximity to an interconnect (10) between adjacent light-emitting diodes (1), which diverting arrangement (4,50) is realized to divert electrostatic discharge ($S_2$) from the interconnect (10) to a region of low potential (21,22, GND). The invention further describes an automotive lighting assembly (3A,3B) comprising such a diode lighting arrangement (1A, 1B,1C). The invention also describes a method of manufacturing a diode lighting arrangement (1A,1B,1C) which method comprises the steps of serially connecting a light-emitting diode arrangement (1,2) comprising at least two exposed serially connected light-emitting diodes (1) in parallel with an electrostatic discharge protection diode arrangement (2); and arranging an electrostatic discharge diverting arrangement (4,50,60) to extend in physical proximity to at least one interconnect (10) between adjacent light-emitting diodes (1), which diverting arrangement (4,50) is realized to divert electrostatic discharge ($S_2$) from the interconnect (10) to a region of low potential (21,22, GND).

19 Claims, 4 Drawing Sheets

(51) Int. Cl.
*H05B 33/08* (2006.01)
*H01L 27/15* (2006.01)

(52) U.S. Cl.
CPC .......... *H05B33/089* (2013.01); *H05B 33/0809* (2013.01); *H01L 2924/0002* (2013.01); *Y02B 20/341* (2013.01)

(56) References Cited

U.S. PATENT DOCUMENTS

| | | | |
|---|---|---|---|
| 2002/0047596 A1* | 4/2002 | Guthrie et al. | 315/200 A |
| 2004/0130331 A1* | 7/2004 | Frederick | F21S 4/001 324/555 |
| 2005/0156186 A1 | 7/2005 | Lin | |
| 2005/0167680 A1* | 8/2005 | Shei | H01L 25/167 257/79 |
| 2005/0173713 A1* | 8/2005 | Lin et al. | 257/81 |
| 2007/0090488 A1* | 4/2007 | Teng et al. | 257/603 |
| 2008/0122606 A1* | 5/2008 | Bradley | 340/468 |
| 2009/0135618 A1* | 5/2009 | Chang et al. | 362/464 |
| 2009/0179593 A1 | 7/2009 | Yang | |
| 2009/0323238 A1 | 12/2009 | Gehrke | |
| 2011/0012144 A1* | 1/2011 | An | 257/91 |
| 2011/0147466 A1* | 6/2011 | Kang et al. | 235/492 |
| 2011/0198655 A1* | 8/2011 | De Graaf et al. | 257/98 |
| 2011/0297976 A1* | 12/2011 | Chao et al. | 257/89 |
| 2011/0316011 A1* | 12/2011 | Ito et al. | 257/88 |
| 2012/0043884 A1* | 2/2012 | Lee et al. | 315/32 |
| 2012/0056217 A1* | 3/2012 | Jung et al. | 257/89 |
| 2012/0074846 A1* | 3/2012 | Marreiro | H05B 33/0866 315/122 |
| 2012/0110141 A1* | 5/2012 | Biderman et al. | 709/219 |
| 2012/0211773 A1* | 8/2012 | Fleming et al. | 257/88 |
| 2013/0093357 A1* | 4/2013 | Lee et al. | 315/297 |
| 2014/0246686 A1* | 9/2014 | Kazama | 257/88 |
| 2015/0009649 A1* | 1/2015 | Jagt et al. | 362/84 |
| 2015/0042229 A1* | 2/2015 | Duan et al. | 315/119 |

FOREIGN PATENT DOCUMENTS

| | | |
|---|---|---|
| JP | 2008166099 A | 7/2008 |
| JP | 2009088396 A | 4/2009 |
| JP | 2011009298 | 1/2011 |

* cited by examiner

DIODE LIGHTING ARRANGEMENT

CROSS-REFERENCE TO PRIOR APPLICATIONS

This application is a U.S. national stage application under 35 U.S.C. §371 of International Application No. PCT/IB2012/052707, filed on May 30, 2012, which claims priority to and the benefit of European Patent Application No. 11169059.0, filed on Jun. 8, 2011. These applications are hereby incorporated by reference herein.

FIELD OF THE INVENTION

The invention describes a diode lighting arrangement, an automotive lighting assembly comprising such a diode lighting arrangement, and a method of manufacturing a diode lighting arrangement.

BACKGROUND OF THE INVENTION

Lighting solutions using diodes are becoming more prevalent as the manufacture of powerful and bright diodes is becoming more economical. A diode lighting arrangement can comprise a single light-emitting diode, or several light-emitting diodes connected in series. The diode(s) should be protected from electrostatic discharge, since the current surge passing through a diode (in either direction) as a result of electrostatic discharge can severely damage the diode. For this reason, prior art protection circuits include an electrostatic discharge (ESD) diode, usually a pair of zener diodes arranged back-to-back, connected in parallel with the light-emitting diode(s). Depending on the surroundings in which the diode lighting arrangement is operated, high voltages in the region of several tens of kilovolts can build up. For an encapsulated device, the light-emitting diodes and the ESD diode are enclosed in a plastic dome or package, so that an electrostatic discharge can only unload into a terminal of the packaged device, and the current can safely discharge through the ESD diode.

In a high-power LED arrangement, where the brightness or luminance of the light source is essential as e.g. in automotive headlamp applications the LEDs are usually not encapsulated with such a dome or plastic cover. A dome can improve the outcoupling efficiency, but usually magnifies the source and thus reduces luminance. Instead, the flat LEDs are arranged side by side on a substrate, and can either be left exposed, or can be coated with a material that serves to adjust the colour of the emitted light. White light is typically generated by converting part of the blue light emitted from an LED into yellow light. The mixing of the blue and yellow light results in a white colour. The series connection of two or more such 'exposed' light-emitting diodes is generally made by metalized areas extending from the positive terminal of one diode to the negative terminal of the next diode in series. In such a 'multi-junction' or 'multi-die' arrangement, the light-emitting diode dies can be vulnerable to ESD damage, even when an ESD diode is used, since a surge might discharge at an interconnect between two neighbouring dies, so that a high current flows through one or more of the exposed dies. Even if the dies are surrounded by a filler material (which can be used to collect any light escaping at the edges of a phosphor coating applied to the emitting surface of the dies), such a filler may not extend to completely cover the edges of the flat metalized interconnect surfaces. Even a small exposed area can serve as a point at which electrostatic discharge can unload and damage or destroy one or more LEDs. Electrostatic charge can build up, for example, on the inside of a plastic or glass outer cover enclosing such a diode lighting arrangement from a distance, for example the outer cover of a vehicle headlight or rear light that encloses the diode lighting arrangement, a ballast, any secondary optics, etc. The electrostatic charge, which can easily reach 10 kV or more, might discharge into one of the interconnects, and the resulting high current can damage or destroy one or more of the light-emitting diodes. Therefore, these interconnects are a weak point of such a lighting arrangement. One possible solution might be to coat the entire interior surface of such a plastic or glass housing with a transparent conductive material such as indium tin oxide, so that electrostatic discharge cannot build up. However, such a coating is expensive, so that this solution is not particularly attractive. An alternative solution might be to connect the interior surface of the (uncoated) plastic housing to a lower potential such as ground, for example by means of a flat metal strip connected between the cover and the ESD diode of the lighting arrangement or another current sink of the ballast, so that any electrostatic charge would be diverted safely away from the lighting arrangement. However, particularly in an automotive lighting application, it can be complicated and costly to ensure that the different components are connected to ground, since each component (lighting arrangement, ballast, outer cover) may be sourced from a different supplier. Such a complex solution could add considerably to the overall cost of a lighting arrangement.

Therefore, it is an object of the invention to provide a straightforward and economical way of protecting a diode lighting arrangement from electrostatic discharge.

SUMMARY OF THE INVENTION

The object of the invention is achieved by the diode lighting arrangement of claim 1, by the automotive lighting assembly of claim 11, and by the method of claim 12 of manufacturing a diode lighting arrangement.

According to the invention, the diode lighting arrangement comprises a multi-die light-emitting diode arrangement comprising at least two exposed serially connected light-emitting diodes connected in parallel with an electrostatic discharge protection diode arrangement, and a supplementary electrostatic discharge (ESD) diverting arrangement extending in physical proximity to at least one interconnect between adjacent light-emitting diodes, which ESD diverting arrangement is realised to divert electrostatic discharge from the interconnect to a region of lower potential.

Here, the expression "in physical proximity to" is to be understood to mean that the ESD diverting arrangement is arranged so close to an interconnect between neighbouring light-emitting diodes that it effectively lies in the path of an electrostatic discharge directed towards the diode lighting arrangement. An interconnect is to be understood to mean any electrical connection between two neighbouring light-emitting diodes, for example a metalized area on a substrate connecting the positive terminal of one light-emitting diode to the negative terminal of the following light-emitting diode in a series-connected chain.

An advantage of the diode lighting arrangement according to the invention is that the light-emitting diodes are effectively shielded from an electrostatic discharge, since any electrostatic discharge unloading in the vicinity of the interconnects is 'caught' by the ESD diverting arrangement and diverted to a region of lower potential, for example to ground or another current sink. Since such an ESD diverting arrangement offers a "path of least resistance" to the electrostatic charge (in the manner of a lightning conductor), the electrostatic charge will unload via the antenna into the current sink.

In this way, the high current has a safe path to a lower potential and is effectively prevented from passing through—and damaging—any of the light-emitting diodes.

According to the invention, an automotive lighting assembly comprises a diode lighting arrangement according to the invention.

An advantage of such an automotive lighting assembly is that the manufacturers of the various other components of the lighting assembly—for example the manufacturers of a plastic or glass outer cover or housing, or the manufacturers of a ballast—need not expend any additional design effort in including complementary grounding circuitry, so that the costs of a lighting assembly according to the invention, with reliable ESD protection to shield the relatively expensive diode lighting arrangement, is very economical.

According to the invention, the method of manufacturing a diode lighting arrangement comprises the steps of serially connecting a light-emitting diode arrangement comprising at least two exposed serially connected light-emitting diodes in parallel with an electrostatic discharge protection diode arrangement; and arranging an electrostatic discharge diverting arrangement to extend in physical proximity to at least one interconnect between adjacent light-emitting diodes, which diverting arrangement is realised to divert electrostatic discharge from an interconnect to a region of lower potential.

The dependent claims and the following description disclose particularly advantageous embodiments and features of the invention. Features of the claims may be combined as appropriate to arrive at further embodiment. Features described in the context of one claim category can apply equally to another claim category.

Usually, lighting arrangements using exposed light-emitting diodes are used for high-power lighting applications, in which a high level of luminous flux and/or luminance is desired. For such applications, laser diodes may be chosen, since these are capable of producing a high light output. Therefore, without restricting the invention in any way, the terms 'light-emitting diode', 'high-power light-emitting diode' and 'laser diode' may be used interchangeably in the following. The term 'die' can also be used to refer to a light-emitting diode or laser diode, since the light-emitting surface of such a diode is effectively the surface of the die itself.

The electrostatic discharge diverting arrangement can comprise any electrically conductive device or element that effectively serves as an attractor to 'collect' or 'catch' an electrostatic discharge before this unloads into an interconnect between dies. Therefore, in a preferred embodiment of the invention, the electrostatic discharge diverting arrangement comprises an antenna or extended electrode arranged essentially alongside the interconnect(s) between the serially connected dies.

Of course, such an ESD diverting arrangement should be as unobtrusive as possible. Preferably, therefore, the antenna comprises a metal strip applied to a substrate of the light-emitting diode arrangement. A thin metal strip can be applied close to the light-emitting diodes of the circuit arrangement in the manner of a frame or outline. The metal can be applied with any suitable technique, for example using moulded interconnect device (MID) technology, a suitable printing process, adhesive bonding, etc.

A diode lighting arrangement can be surface mounted on a substrate of the lighting assembly. An additional component can serve to collect and shape the light in an appropriate manner, depending on the application for which the diode lighting arrangement is to be used. Therefore, in a further preferred embodiment of the invention, the diode lighting arrangement comprises an enclosing component arranged about the light-emitting diodes, wherein the ESD diverting arrangement comprises a metalized surface of the enclosing component. Here, the term "arranged about" is to be understood to mean that the enclosing component can act as a surround or frame for the light-emitting diodes without detracting from the light output. For example, the light-emitting diodes of the diode lighting arrangement can be arranged in the base of a recess, and the recess can have one or more metalized interior surfaces, for example to ensure that as little light as possible is absorbed by the surface(s) of the recess. A metalized interior surface that extends along the interconnects of the dies can be electrically connected to a lower potential, for example to a node of an ESD diode of the diode lighting arrangement. In this way, any ESD unloading in the vicinity of the metalized interior surface of the recess will be safely diverted to the ESD diode.

For lighting applications requiring a certain light bundle shape or beam shape, a shaping element is usually used to collect and shape the light emitted by the light-emitting diodes. In a further preferred embodiment of the invention, therefore, the enclosing component comprises a collimator. For a front beam application, for example, such a collimator generally serves to ensure a defined bright/dark cut-off and a distribution of light that is suitable for illuminating a region of the road at a certain distance from the vehicle in which the lighting assembly is mounted. To this end, such a collimator can have a highly reflective interior coating so that essentially none of the emitted light is wasted or lost, and such a reflective coating generally comprises a metallic coating, which is therefore also electrically conductive. Therefore, in another preferred embodiment of the invention, the ESD diverting arrangement comprises a reflective coating of the collimator.

The lighting assembly according to the invention is preferably realised to be arranged inside a light-transmissive housing of an automotive lighting unit. Electrostatic charge can build up gradually or rapidly on the interior surface of the housing, for example as a result of friction caused by physical contact at the exterior of the housing, or even as a result of wind passing over the exterior of the housing. For the reasons given in the introduction, a direct connection between an outer cover and ground or an ESD diode of the diode lighting arrangement is too costly to be practicable. The diode lighting arrangement according to the invention actively allows the electrostatic charge to be attracted towards the diode lighting arrangement where it can be safely diverted by means of the ESD diverting arrangement into ground. However, because a connection to ground is not always provided by a ballast of such a diode lighting arrangement, the ESD diverting arrangement is preferably electrically connected to a node of the ESD diode. With such a diode lighting arrangement according to the invention, any ESD discharge from the interior surface of the housing in the direction of the light-emitting diodes will be safely and effectively diverted to a current sink.

To ensure that any ESD unloading towards the lighting arrangement from any direction is reliably diverted by the ESD diverting arrangement, this is preferably arranged at a distance of preferably at most 3.0 mm, more preferably at most 1.0 mm, most preferably at most 0.3 mm from the interconnect(s), or from the outer edges of the interconnect(s), of the lighting arrangement. For instance, an antenna can be applied at a distance of 0.5 mm alongside the dies of a lighting arrangement, or a collimator can be arranged about the lighting arrangement so that the base or bottom edge of one of its sides having a metalized surface is arranged at a distance of 0.2 mm alongside the dies of the lighting arrangement. Such a small separation is sufficient to ensure that any ESD unloading in the direction of the lighting arrangement is reliably diverted into a current sink, for example into a node of the ESD diode arrangement.

Preferably, the ESD discharge diverting arrangement is dimensioned to accommodate a voltage surge of up to 2.0 kV, more preferably up to 8 kV, most preferably up to 15 kV. This can be achieved, for example, by appropriate choice of width and length of an antenna arranged alongside the interconnects of the diode lighting arrangement, or by an appropriate metalized of a collimator.

A diode lighting arrangement can comprise any suitable combination of light-emitting diodes and ESD diode arrangements. For example, diode lighting arrangements can be connected in series to obtain a lighting device with a higher light output. The series connection effectively presents another vulnerable interconnect that could potentially be an attractor for an electrostatic discharge. Therefore, in a further preferred embodiment of the invention, a diode lighting arrangement comprises a first light-emitting diode arrangement connected in series with a second light-emitting diode arrangement, and wherein the electrostatic discharge diverting arrangement extends in physical proximity to at least one interconnect between adjacent light-emitting diodes of the first light-emitting diode arrangement and at least one interconnect between adjacent light-emitting diodes of the second light-emitting diode arrangement. In this way, all of the interconnects between light-emitting diodes of the combined lighting arrangement can be protected from ESD damage by a single ESD diverting arrangement.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
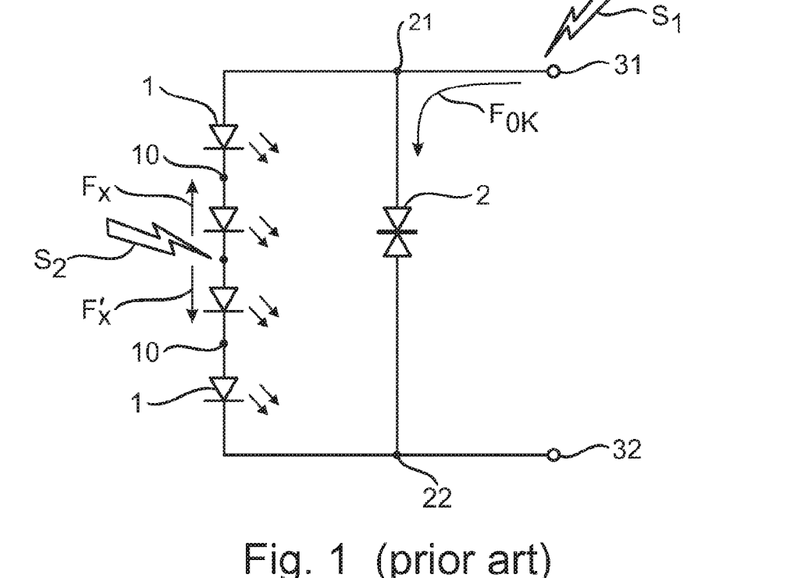
FIG. 1 shows an electrical circuit of a prior art diode lighting arrangement.

FIG. 1 shows an electrical circuit of a prior art diode lighting arrangement. Here, four non-encapsulated light-emitting diodes 1 are connected in series, so that an interconnect 10 is located between each pair of adjacent light-emitting diodes 1. This serial arrangement is connected in parallel with an ESD diode 2 arrangement, in this case a back-to-back zener diode arrangement 2, across nodes 21, 22. A voltage can be applied across two input terminals 31, 32 to drive the light-emitting diodes. A voltage surge resulting from an electrostatic charge $S_1$ at any of the input terminals 31, 32 or in the vicinity of a node 21, 22 is usually reliably diverted through the ESD diode 2, for example along in the direction $F_{OK}$, so that the light-emitting diodes 1 are not affected. However, if electrostatic charge $S_2$ builds up in the vicinity of a vulnerable interconnect 10, a resulting voltage surge $S_2$ can discharge through the light-emitting diodes 1 instead, for example in either or both directions $F_X$, $F_{X'}$, resulting in damage to one or more of the light-emitting diodes 1 and failure of the diode lighting arrangement.

Figure 2:
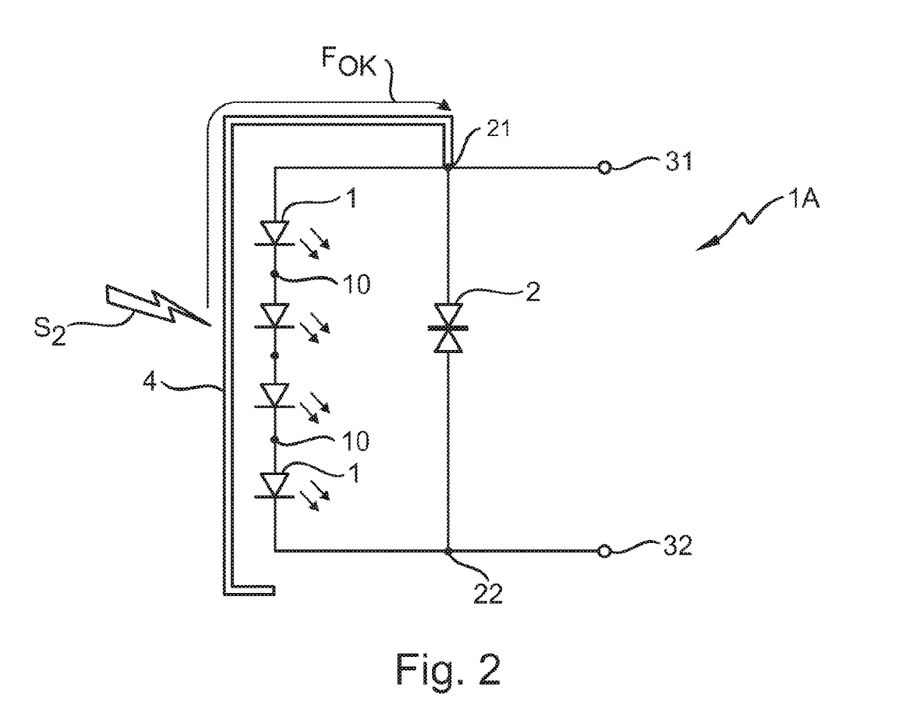
FIG. 2 shows an electrical circuit of a diode lighting arrangement according to a first embodiment of the invention.

FIG. 2 shows a circuit diagram of a diode lighting arrangement 1A according to a first embodiment of the invention. Here, the same basic circuit is implemented as used in FIG. 1 above. However, the light-emitting diodes 1 are shielded from electrostatic discharge by an ESD diverting arrangement, in this case an 'antenna' 4 or additional electrode 4 arranged to lie alongside the light-emitting diodes 1 and their interconnects 10. Of course, the 'antenna' 4 does not have any signalling function, and is only referred to as an antenna on account of its long, narrow and open-ended form. Any electrostatic charge $S_2$ that might build up in the vicinity of the light-emitting diodes 1 can safely discharge through the antenna 4, which diverts the current in a direction $F_{OK}$ through the ESD diode 2.

Figure 3:
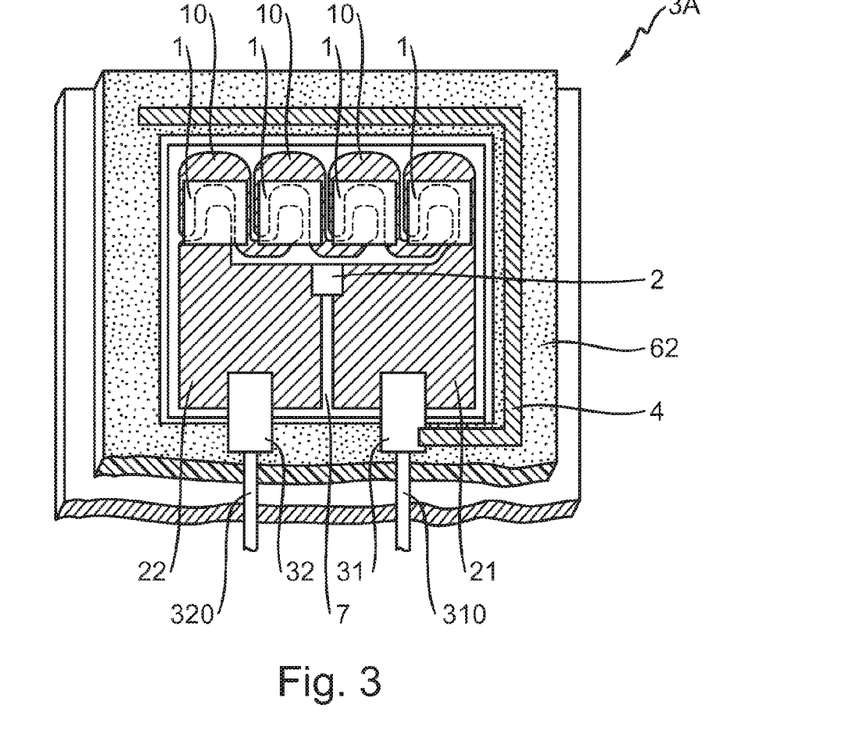
FIG. 3 shows an automotive lighting assembly according to a first embodiment of the invention.

FIG. 3 partially shows a first embodiment of an automotive lighting assembly 3A using a diode lighting arrangement of FIG. 2. Here, the light-emitting diodes 1 are mounted onto a ceramic printed circuit board 7 which is then attached to a metal base 61 or heat spreader 61. Metalized regions 21, 22, 10 form electrical connections 21, 22, 10 between the positive and negative terminals of the light-emitting diodes 1. Here, the diodes 1 comprise essentially square dies 1 applied to partially cover the metalized areas 21, 22, 10. The metalized regions underneath the dies 1 are indicated by broken lines. The heat spreader 61 can be connected to another part, for example to a heat sink of a headlight housing (not shown). A frame 62 or surround 62 is mounted on the base 61, and may be formed in some suitable manner to include electrical connectors for driving the light-emitting diodes, or be formed for adaption to electrical connectors 310, 320. The frame 62 (which can be made of plastic) and the electrical connectors 310, 320, are indicated very schematically in this diagram. In this embodiment, an antenna 4 is applied onto the surface of the frame 62 using an appropriate technique, for example as a moulded interconnect device (MID). The antenna 4 serves to divert an electrostatic discharge to the nodes 21, 22 of an ESD diode 2 in order to shield the light-emitting diodes 1 from the damaging effects of a surge. Here, one end of the antenna 4 is shown to be electrically connected, e.g. by soldering, to an input terminal 31. Of course, that end of the antenna could equally well be connected to one of the metalized regions 21, 22. Usually, however, a covering is applied to the ceramic PCB to cover all elements 21, 22, 2, 19 except the light-emitting diodes 1, so that a soldered connection to an input terminal is generally simpler to carry out.

Figure 4:
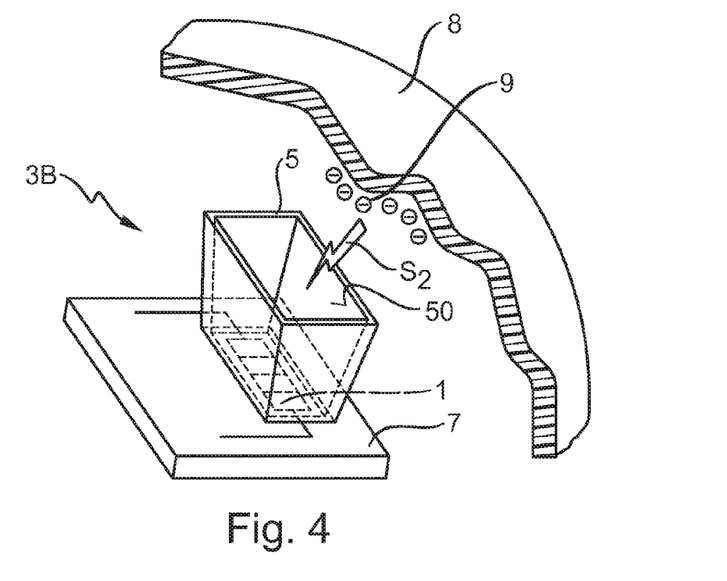
FIG. 4 shows a schematic representation of an automotive lighting assembly according to a second embodiment of the invention.

FIG. 4 shows a schematic representation of an automotive lighting assembly 3B according to a second embodiment of the invention. The diode lighting arrangement is realized to be mounted within a plastic light-transmissive outer cover 8, for example of a front or rear lighting unit. Here, a collimator 5 is arranged around the light-emitting diodes 1 in order to shape the light emitted by the light-emitting diodes 1 during operation (it should be noted that the diode lighting arrangement, collimator 5 and outer cover 8 are not drawn to scale). To ensure no light is wasted, such a collimator 5 is generally arranged very close to the light-emitting diodes 1. In this realization, the collimator 5 has a reflective interior surface 50 made by metallization of the collimator interior. The metalized surface 50 is electrically connected at some point, for example a point along its base, to a node of the ESD diode (not shown in the diagram), so that the metalized surface 50 acts as an ESD diverting arrangement. Any electrostatic discharge $S_2$ that might build up close to the collimator 5, for example on the interior of the plastic cover 8 (indicated here by a build-up of negative ions 9) will be effectively diverted away from any interconnects between the light-emitting diodes 1 and into the ESD diode, so that these are protected from the damaging effects of such a surge $S_2$.

Figure 5:
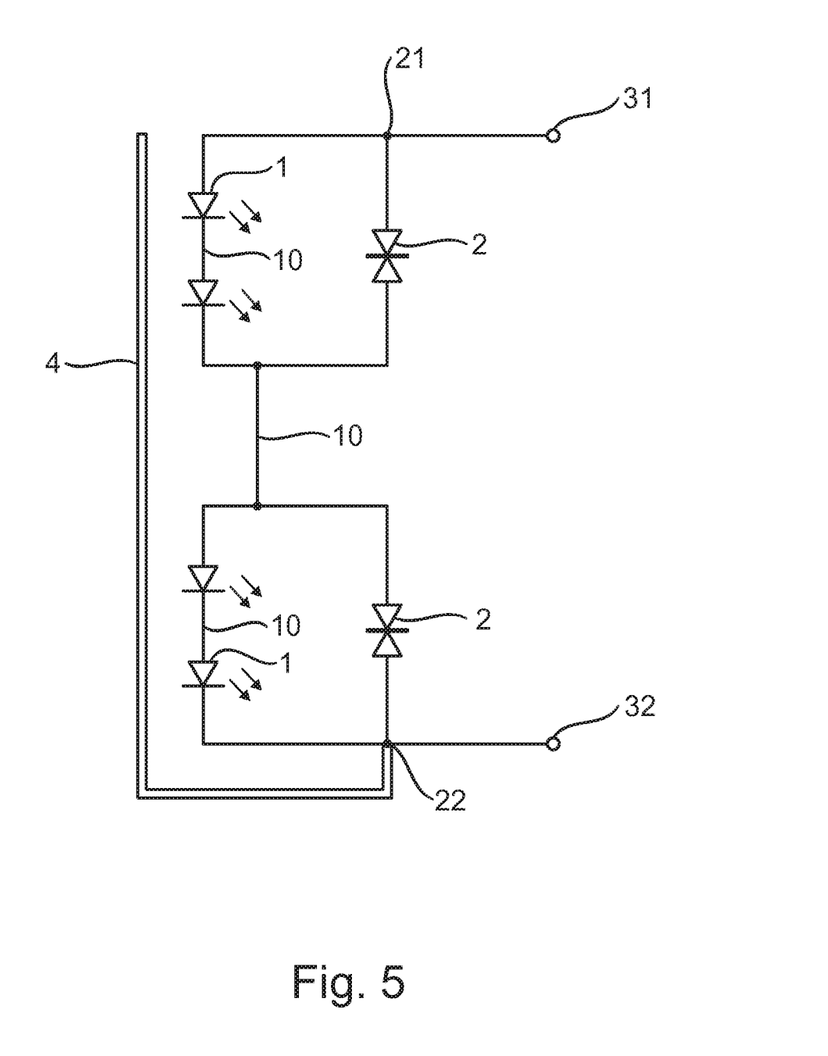
FIG. 5 shows a circuit diagram of a diode lighting arrangement according to a second embodiment of the invention.

FIG. 5 shows a circuit diagram of a diode lighting arrangement 1B according to a second embodiment of the invention. Here, two pairs of light-emitting diodes 1 have been connected in series. Each light-emitting diode pair is connected in parallel with its own ESD diode arrangement 2. Effectively, there are three interconnects 10 that could serve as entry points for a voltage surge. Therefore, in this embodiment, an antenna 4 is arranged along the light-emitting diode pairs so that it can shield all these interconnects 10 from such a surge, diverting any surge current $F_{OK}$ via an ESD diode node 22 through the ESD diode arrangement 2, so that the light-emitting diodes 1 are protected from ESD damage.

Figure 6:
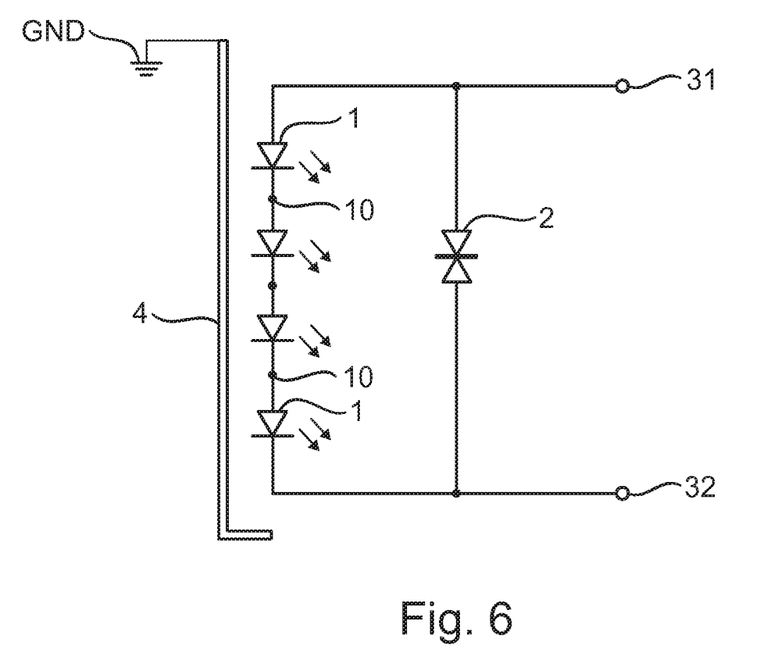
FIG. 6 shows an electrical circuit of a diode lighting arrangement according to a second embodiment of the invention.

FIG. 6 shows a circuit diagram of a diode lighting arrangement 1C according to a third embodiment of the invention. In this embodiment, an antenna 4 is arranged alongside the interconnects 10 between the light-emitting diodes 1, and terminates at ground GND instead of at a node of the ESD diode 2. For example, the metal body of the antenna can be arranged to contact the metal heat spreader 61 shown in FIG. 3 above, and indicated schematically here by the electrical symbol for 'ground'. Because of the relatively large volume of the heat spreader and the heat sink to which it is connected, this can have such a low potential that it can act as ground, even if it is not explicitly connected to electrical ground. Of course, the heat spreader/heat sink could also be directly connected to ground, depending on the realization of the lighting unit. With such an embodiment, any electrostatic discharge unloading in the region of the interconnects can be reliably diverted to ground.

Although the present invention has been disclosed in the form of preferred embodiments and variations thereon, it will be understood that numerous additional modifications and variations could be made thereto without departing from the scope of the invention. For example, a diode lighting arrangement can comprise any combination of exposed diodes and ESD diode arrangements. Furthermore, the ESD diode arrangements can be connected at any suitable distance from the diodes, and need not necessarily be connected in close proximity as indicated in the diagrams.

For the sake of clarity, it is to be understood that the use of "a" or "an" throughout this application does not exclude a plurality, and "comprising" does not exclude other steps or elements.

The invention claimed is:

1. A diode lighting arrangement, comprising:
   an electrostatic discharge protection diode arrangement;
   a light-emitting diode arrangement comprising at least two exposed serially connected light-emitting diodes connected in parallel with the electrostatic discharge protection diode arrangement; and
   an electrostatic discharge diverting arrangement extending in physical proximity to an interconnect between adjacent light-emitting diodes of the light-emitting diode arrangement, wherein the electrostatic discharge diverting arrangement comprises an open-ended electrode coupled to the electrostatic discharge protection diode arrangement to divert electrostatic discharge from the interconnect to a region of low potential.

2. The diode lighting arrangement according to claim 1, wherein the open-ended electrode comprises an antenna arranged essentially alongside the interconnect.

3. The diode lighting arrangement according to claim 1, comprising an enclosing component arranged about the light-emitting diodes of the light-emitting diode arrangement, wherein the open-ended electrode comprises a metalized surface of the enclosing component.

4. The diode lighting arrangement according to claim 3, wherein:
   the enclosing component comprises a collimator; and
   the metalized surface comprises a reflective coating on an interior surface of the collimator.

5. The diode lighting arrangement according to claim 1, comprising an electrical connection between the electrostatic discharge diverting arrangement and a node of the electrostatic discharge protection diode arrangement.

6. The diode lighting arrangement according to claim 5, wherein the electrostatic discharge protection diode arrangement comprises an electrostatic discharge diode.

7. The diode lighting arrangement according to claim 1, comprising a separation between the interconnect and the electrostatic discharge diverting arrangement of at most 3.0 mm.

8. The diode lighting arrangement according to claim 1, wherein the electrostatic discharge diverting arrangement is dimensioned to accommodate a voltage surge of up to 15.0 kV.

9. The diode lighting arrangement according to claim 1, comprising a first light-emitting diode arrangement connected in series with a second light-emitting diode arrangement, and wherein the electrostatic discharge diverting arrangement extends in physical proximity to at least one interconnect between adjacent light-emitting diodes of the first light-emitting diode arrangement and at least one interconnect between adjacent light-emitting diodes of the second light-emitting diode arrangement.

10. An automotive lighting assembly comprising a diode lighting arrangement according to claim 1.

11. The automotive lighting assembly according to claim 10, wherein the automotive lighting assembly is realised to be arranged inside a light-transmissive outer cover of an automotive lighting unit.

12. The diode lighting arrangement according to claim 1, comprising a separation between the interconnect and the electrostatic discharge diverting arrangement of at most 1.0 mm.

13. The diode lighting arrangement according to claim 1, comprising a separation between the interconnect and the electrostatic discharge diverting arrangement of at most 0.3 mm.

14. The diode lighting arrangement according to claim 1, wherein the electrostatic discharge diverting arrangement is dimensioned to accommodate a voltage surge of up to 2.0 kV.

15. The diode lighting arrangement according to claim 1, wherein the electrostatic discharge diverting arrangement is dimensioned to accommodate a voltage surge of up to 8.0 kV.

16. A diode lighting arrangement, comprising:
   an electrostatic discharge protection diode arrangement;
   a light-emitting diode arrangement comprising at least two exposed serially connected light-emitting diodes connected in parallel with the electrostatic discharge protection diode arrangement; and
   an electrostatic discharge diverting arrangement extending in physical proximity to an interconnect between adjacent light-emitting diodes of the light-emitting diode arrangement, wherein:
   the electrostatic discharge diverting arrangement is configured to divert electrostatic discharge from the interconnect to a region of low potential;

the electronic discharge diverting arrangement comprises an antenna arranged essentially alongside the interconnect; and the antenna comprises a metal strip applied to a frame of the light-emitting diode arrangement.

17. A diode lighting arrangement, comprising:

an electrostatic discharge protection diode arrangement;

a light-emitting diode arrangement comprising at least two exposed serially connected light-emitting diodes connected in parallel with the electrostatic discharge protection diode arrangement;

an electrostatic discharge diverting arrangement extending in physical proximity to an interconnect between adjacent light-emitting diodes of the light-emitting diode arrangement, wherein the electrostatic discharge diverting arrangement is configured to divert electrostatic discharge from the interconnect to a region of low potential; and a collimator arranged about the light-emitting diodes of the light-emitting diode arrangement, wherein the electrostatic discharge diverting arrangement comprises a metalized surface of the collimator.

18. A method of manufacturing a diode lighting arrangement, comprising:

connecting a light-emitting diode arrangement comprising at least two exposed serially connected light-emitting diodes in parallel with an electrostatic discharge protection diode arrangement;

arranging an electrostatic discharge diverting arrangement to extend in physical proximity to at least one interconnect between adjacent light-emitting diodes of the light-emitting diode arrangement and to be coupled to the electrostatic discharge protection diode arrangement, the electrostatic discharge diverting arrangement comprising an open-ended electrode; and configuring the electrostatic discharge diverting arrangement to divert electrostatic discharge from the interconnect to a region of low potential.

19. The method according to claim 18, further comprising:

connecting a first light-emitting diode arrangement in series with a second light-emitting diode arrangement; and extending the electrostatic discharge diverting arrangement in physical proximity to at least one interconnect between adjacent light-emitting diodes of the first light-emitting diode arrangement and at least one interconnect between adjacent light-emitting diodes of the second light-emitting diode arrangement.

\* \* \* \* \*